(12) United States Patent
Lee et al.

(10) Patent No.: US 10,593,771 B2
(45) Date of Patent: Mar. 17, 2020

(54) VERTICAL FIN-TYPE BIPOLAR JUNCTION TRANSISTOR WITH SELF-ALIGNED BASE CONTACT

(71) Applicant: INTERNATIONAL BUSINESS MACHINES CORPORATION, Armonk, NY (US)

(72) Inventors: Choonghyun Lee, Rensselaer, NY (US); Seyoung Kim, Weschester, NY (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/837,321

(22) Filed: Dec. 11, 2017

(65) Prior Publication Data

US 2019/0181236 A1   Jun. 13, 2019

(51) Int. Cl.
*H01L 29/06* (2006.01)
*H01L 29/423* (2006.01)
(Continued)

(52) U.S. Cl.
CPC .. *H01L 29/42304* (2013.01); *H01L 21/76897* (2013.01); *H01L 29/0821* (2013.01);
(Continued)

(58) Field of Classification Search
CPC ............ H01L 29/42304; H01L 29/732; H01L 29/66272; H01L 29/0821; H01L 29/66318;
(Continued)

(56) References Cited

U.S. PATENT DOCUMENTS

| 4,338,138 A | * | 7/1982 | Cavaliere | ............. H01L 21/033 |
| | | | | 148/DIG. 131 |
| 4,812,894 A | * | 3/1989 | Nakamura | ............ H01L 23/485 |
| | | | | 257/256 |

(Continued)

FOREIGN PATENT DOCUMENTS

| CN | 101908485 A | 12/2010 |
| WO | 2016178837 A1 | 11/2016 |

OTHER PUBLICATIONS

Yu, H. et al., "Ultralow-Resistivity CMOS Contact Scheme with Pre-Contact Amorphization Plus Ti (Germano-) Silicidation" 2016 IEEE Symposium on VLSI Technology Digest of Technical Papers (Jun. 2016) pp. 1-2.

(Continued)

*Primary Examiner* — Jarrett J Stark
(74) *Attorney, Agent, or Firm* — Tutunjian & Bitetto, P.C.; Erik Johnson

(57) ABSTRACT

A bipolar junction transistor includes a collector having a first surface on a first level and a second surface on a second level. A base is formed on the second level of the collector, and an emitter is formed on the base. A dielectric liner is formed on vertical sidewalls of the collector, the base and the emitter and over the first surface. A conductive region is formed adjacent to the base in the dielectric liner. A base contact is formed along one of the vertical sidewalls to connect to the base through the conductive region.

20 Claims, 7 Drawing Sheets

(51) Int. Cl.
*H01L 29/737* (2006.01)
*H01L 21/768* (2006.01)
*H01L 29/66* (2006.01)
*H01L 29/417* (2006.01)
*H01L 29/08* (2006.01)
*H01L 29/732* (2006.01)
*H01L 29/40* (2006.01)
*H01L 29/10* (2006.01)

(52) U.S. Cl.
CPC ........ *H01L 29/1004* (2013.01); *H01L 29/401* (2013.01); *H01L 29/41708* (2013.01); *H01L 29/66242* (2013.01); *H01L 29/66272* (2013.01); *H01L 29/66318* (2013.01); *H01L 29/732* (2013.01); *H01L 29/7371* (2013.01); *H01L 29/0649* (2013.01); *H01L 29/0653* (2013.01)

(58) Field of Classification Search
CPC ........... H01L 21/76897; H01L 29/7371; H01L 29/41708
See application file for complete search history.

(56) References Cited

U.S. PATENT DOCUMENTS

| | | | | |
|---|---|---|---|---|
| 4,949,151 | A * | 8/1990 | Horiuchi | H01L 21/743 257/508 |
| 6,265,275 | B1 | 7/2001 | Marty et al. | |
| 6,329,699 | B2 * | 12/2001 | Kitahata | H01L 21/76224 257/514 |
| 6,437,376 | B1 | 8/2002 | Ozkan | |
| 6,727,528 | B1 * | 4/2004 | Robins | H01L 21/76229 257/133 |
| 6,982,442 | B2 | 1/2006 | Chan et al. | |
| 7,338,875 | B2 | 3/2008 | Lojek | |
| 8,823,140 | B2 | 9/2014 | Nie et al. | |
| 8,932,931 | B2 | 1/2015 | Faucher et al. | |
| 9,048,280 | B2 | 6/2015 | Cai et al. | |
| 9,859,172 | B1 * | 1/2018 | Anderson | H01L 21/8249 |
| 10,115,800 | B1 * | 10/2018 | Kim | H01L 21/02112 |
| 2002/0096690 | A1 * | 7/2002 | Nemati | G11C 11/39 257/133 |
| 2002/0185656 | A1 * | 12/2002 | Aoki | H01L 29/7378 257/197 |
| 2003/0121468 | A1 * | 7/2003 | Boone | C30B 23/02 117/78 |
| 2004/0099880 | A1 * | 5/2004 | Shaheed | H01L 29/0821 257/197 |
| 2006/0060941 | A1 * | 3/2006 | Sun | H01L 29/0821 257/557 |
| 2007/0102729 | A1 * | 5/2007 | Enicks | H01L 29/1004 257/197 |
| 2008/0099863 | A1 * | 5/2008 | Lee | H01L 27/2445 257/427 |
| 2008/0128749 | A1 * | 6/2008 | Enicks | H01L 29/0817 257/191 |
| 2008/0142836 | A1 * | 6/2008 | Enicks | H01L 21/02381 257/190 |
| 2009/0134939 | A1 * | 5/2009 | Feng | H01L 29/1004 327/581 |
| 2011/0312147 | A1 * | 12/2011 | Harame | H01L 29/0649 438/353 |
| 2012/0032274 | A1 * | 2/2012 | Erickson | H01L 27/0623 257/378 |
| 2013/0146947 | A1 * | 6/2013 | Chan | H01L 29/66242 257/197 |
| 2015/0348844 | A1 * | 12/2015 | BrightSky | H01L 21/8222 257/5 |
| 2015/0357446 | A1 * | 12/2015 | Tschumakow | H01L 29/66242 257/586 |
| 2016/0093722 | A1 * | 3/2016 | Tilke | H01L 29/732 257/51 |
| 2016/0240636 | A1 * | 8/2016 | Shyu | H01L 29/7371 |
| 2018/0068998 | A1 | 3/2018 | Wang et al. | |
| 2019/0051726 | A1 | 2/2019 | Zhou | |

OTHER PUBLICATIONS

Lee, C.H. et al., "Oxygen Potential Engineering of Interfacial Layer for Deep Sub-nm EOT High-k Gate Stacks on Ge" 2013 IEEE International Electron Devices Meeting (IEDM) (Dec. 2013) pp. 2.5.1-2.5.4.

* cited by examiner

US 10,593,771 B2

VERTICAL FIN-TYPE BIPOLAR JUNCTION TRANSISTOR WITH SELF-ALIGNED BASE CONTACT

BACKGROUND

Technical Field

The present invention generally relates to bipolar junction transistors (BJT), and more particularly to vertically disposed BJTs and methods for making the same having a self-aligned base contact.

Description of the Related Art

Combinations of SiGe heterojunction bipolar transistors (HBT) with Si complementary metal oxide semiconductor (CMOS) fabrication processes facilitate fabrication processes of SiGe BiCMOS devices. Such devices include both bipolar and metal oxide semiconductor (MOS) transistors in a single integrated circuit (IC). There is a demand for scaling bipolar junction transistor (BJT) devices for mobile applications. However, conventional BJT devices are not scalable due to base and collector contact distances being far away from a base of the BJT to prevent shorting between these terminals. The base is very small in these designs making it difficult to contact the base, and the base contact requires a highly doped P+ contact. Conventional BJTs have difficulty in scaling device dimensions due to contacts, especially the base contact.

Lateral scaling and vertical scaling are employed to achieve smaller and faster SiGe HBT devices with greatly increased current densities. Improving operational frequencies remains a significant challenge as the collector and base dopant concentrations are increased to achieve better performance. The increasing current densities of the SiGe HBT puts more focus on interconnects which limit the transistor layout.

SUMMARY

In accordance with an embodiment of the present invention, a bipolar junction transistor includes a collector having a first surface on a first level and a second surface on a second level. A base is formed on the second level of the collector, and an emitter is formed on the base. A dielectric liner is formed on vertical sidewalls of the collector, the base and the emitter and over the first surface. A conductive region is formed adjacent to the base in the dielectric liner. A base contact is formed along one of the vertical sidewalls to connect to the base through the conductive region.

Another bipolar junction transistor includes a collector having a first surface on a first level and a second surface on a second level, a base formed on the second level of the collector and an emitter formed on the base. A metal doped dielectric liner is formed on vertical sidewalls of the collector, the base and the emitter and over the first surface. A conductive region is self-aligned to the base and formed through the dielectric liner corresponding to a position on the vertical sidewall of the base. A base contact is formed along the vertical sidewall of the base to connect to the base through the conductive region. An emitter contact is formed on the emitter, and a collector contact lands on the first level of the collector.

A method for forming a bipolar junction transistor includes forming a collector on or in a substrate; forming a base on the collector; forming an emitter on the base; patterning fins from the emitter, base and into the collector such that the collector includes a bottom surface; depositing a dielectric liner on vertical sidewalls of the collector, the base and the emitter and on the bottom surface of the collector; annealing the dielectric liner to interact with the base to form a self-aligned conductive region through the dielectric liner on the vertical sidewalls; and forming a base contact along one of the vertical sidewalls to connect to the base through the conductive region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
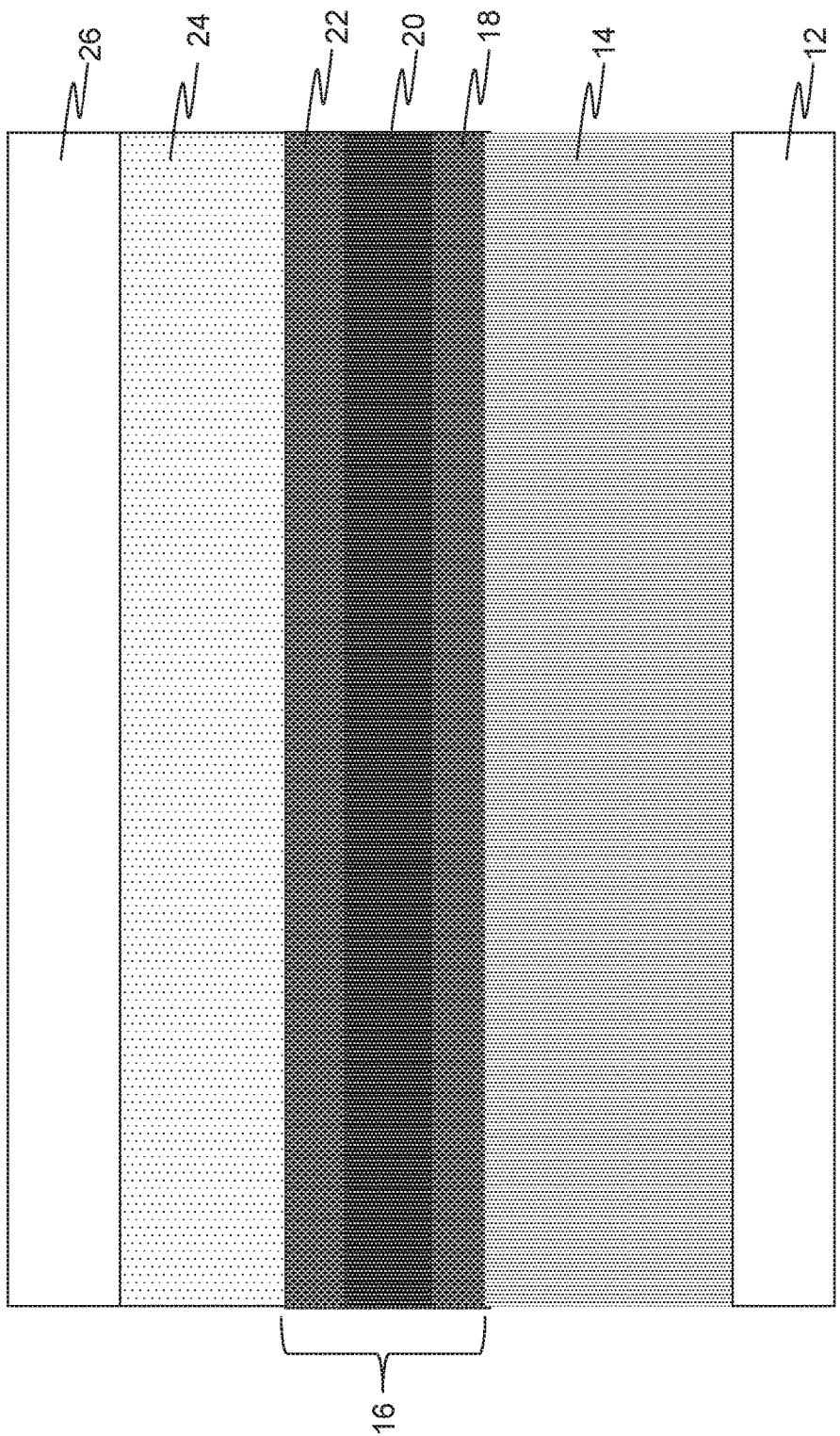
FIG. 1 is a cross-sectional view showing a stack of layers including a collector, base, emitter and hardmask layer in accordance with an embodiment of the present invention.

Aspects of the present invention include methods and structures for forming a self-aligned silicide on a base region of a bipolar junction transistor (BJT) while avoiding emitter/collector to base shorts. In one embodiment, a transition of a dielectric to metallic/conductive material is employed to provide the self-aligned contact. In a particularly useful embodiment, properties of a metal-doped oxide are employed to provide dielectric properties and, after an anneal, convert the metal-doped oxide to a conductive material. In one embodiment, the metal-doped oxide includes a metal doped germanium oxide. While germanium oxide is described as an illustrative embodiment, other materials can also be employed to be converted to conductive materials, e.g., form silicides. By employing a dielectric to conductor conversion, methods and structures in accordance with the present embodiments can resolve risks associated with device yield in highly scaled BJTs. In one or more embodiments, a metal-doped $GeO_2$ and SiGe reaction can be employed on a base region of a BJT to have a self-aligned base contact.

Structures and methods are described for forming the self-aligned base contact, which can be useful in scaling BJTs, e.g., reducing the footprint of the devices. In one illustrative device structure, an emitter and a collector of the BJT can include Si, while the base includes SiGe (e.g., 10% to 50% Ge). A metal-doped $GeO_x$ liner can be formed over end portions (e.g., the thickness) of the SiGe layer. The $GeO_x$ liner can include dopant metal species, such as, e.g., Y, Hf, Al, Sc, La or other metals. The $GeO_x$ liner can be annealed to convert the metal doped $GeO_x$ liner to a metal germanide or metal silicide at positions in contact with the Ge or SiGe of the base. The metal germanide or metal silicide forms a self-aligned contact that contacts the SiGe (or Ge) layer in the BJT. A contact can then be formed to contact the metal germanide or metal silicide.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a partially fabricated semiconductor device 10 is shown in accordance with one embodiment. The device 10 includes a substrate 12. The substrate 12 can include a single layer or multiple layers. The substrate 12 can include any suitable substrate structure, e.g., a bulk semiconductor, and preferably include a monocrystalline structure. In one example, the substrate 12 can include a silicon-containing material. Illustrative examples of Si-containing materials suitable for the substrate 12 can include, but are not limited to, Si, SiGe, SiGeC, SiC and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride, zinc selenide, etc. with intervening buffer layers, if needed.

In accordance with one particularly useful embodiment, the substrate 12 includes a monocrystalline silicon material. The substrate 12 can be employed to form a collector 14 or a collector can be grown on a surface of the substrate 12. In one embodiment, the collector 14 is part of the substrate 12 and is formed by doping the substrate 12 to form the collector region 14. In one embodiment, the substrate 12 can be doped using an ion implantation technique to form a highly n-doped (N++) substrate 12 (e.g., phosphorus or arsenic). The collector 14 can be formed by doping the substrate 12 using an ion implantation technique to form an n-doped (N) collector 14. It should be understood that the doping conductivities for these and other layers can be reversed in other embodiments, e.g., n-doped can be p-doped and p-doped can be n-doped.

A base 16 is formed on the collector 14. The base 16 can include a SiGe material. In one embodiment, the base 16 can include a graded profile of Ge concentration. In one useful embodiments, a high concentration layer 20 can be flanked by lower concentration layers 18 and 22. In one example, the lower concentration layers can include a 10 at % Ge in SiGe while the high concentration layer 20 can include a 30 at % Ge in SiGe. Other percentages are contemplated and can be as high as 50 at % Ge and as low as 1 at % Ge.

The base 16 can be epitaxially grown on the collector 14 and include p-type dopants. The collector 14 can include Si, and the base can include epitaxially grown SiGe. Epitaxy can be performed by ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial Si and/or SiGe can be doped during deposition (in-situ doped) by adding dopants, n-type dopants (e.g., phosphorus or arsenic) or p-type dopants (e.g., boron or gallium), depending on the type of transistor. When SiGe is epitaxially grown, the SiGe may have germanium content in the range of 1% to 50%. The amount of dopants can be varied during the processing to create the graded Ge concentration profile.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

An emitter 24 is formed on the base 16. The emitter 24 can also be epitaxially grown on the base 16. The emitter 24 can include a highly doped Si material (e.g., n-doped (N++)) doped by in-situ doping. A hard mask 26 can be formed on the emitter 24. The hardmask 26 can include a dielectric material, such as SiN or the like. The hardmask 26 can be formed using, e.g., a chemical vapor deposition process.

The layers described in FIG. 1, e.g., layers 16, 24, 26 (and 14 if deposited) are preferably added by a blanket deposition or formation process. This means that the deposition process is across an entire wafer and results in higher quality material.

Figure 2:
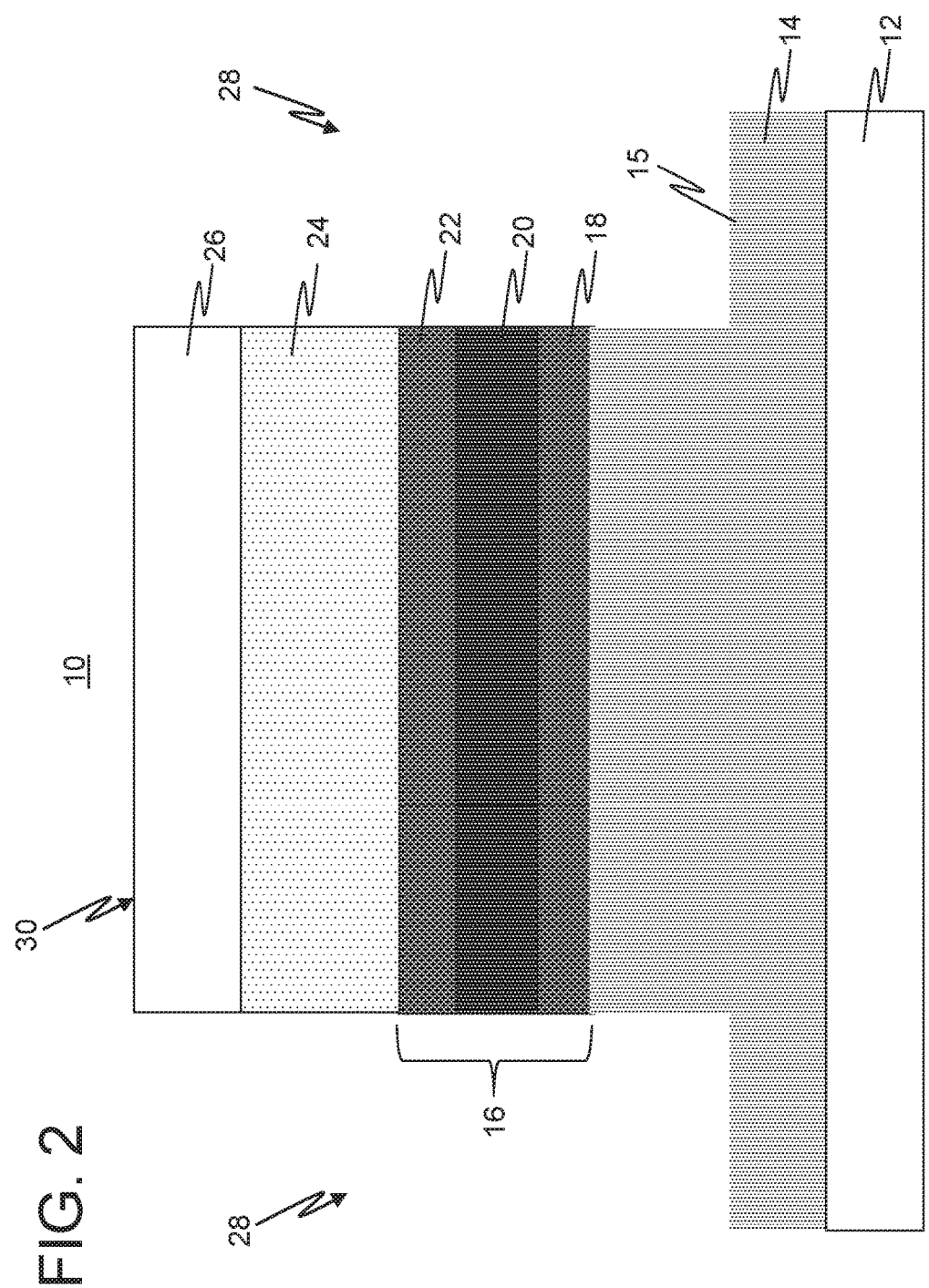
FIG. 2 is a cross-sectional view showing the stack of layers of FIG. 1 patterned to form a vertical fin including the base, the emitter, the hardmask layer and a portion of the collector in accordance with an embodiment of the present invention.

Referring to FIG. 2, fins 30 are patterned on the device 10. The hardmask 26 can be patterned using a lithographic patterning process. The lithographic patterning can include the deposition of a resist (not shown), development of the resist in accordance with a patterned mask and etching the hardmask 26. The resist and/or hardmask 26 can be employed as an etch mask to etch trenches 28 to shape the fins 30.

The etching can include a reactive ion etch (RIE) or other suitable directional etching process. The etching cuts the fin 30 and exposes the constituent layers of the device 10 in the sidewalls of the trenches 28. A landing pad 15 is formed on at least one side of the fin 30 for connecting a contact to the collector 14 in later steps.

Figure 3:
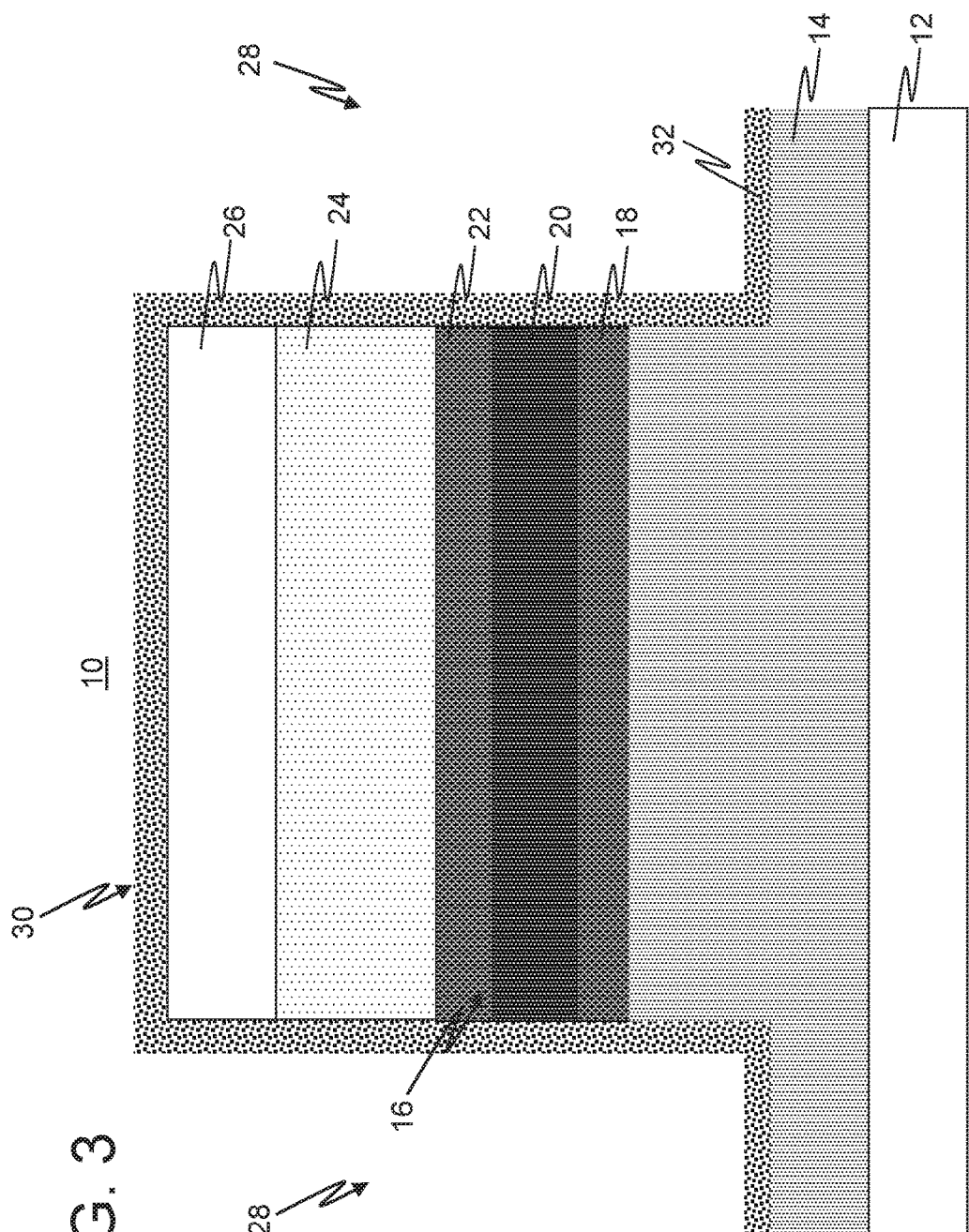
FIG. 3 is a cross-sectional view showing the stack of layers of FIG. 2 having a dielectric liner conformally deposited over the vertical fin including the base, the emitter, the hardmask layer and the portion of the collector in accordance with an embodiment of the present invention.

Referring to FIG. 3, a dielectric deposition process is performed to conformally deposit a dielectric liner 32 over the fin 30 and in the trenches 28. The dielectric liner 32 includes a dielectric material that can interact with at least one layer exposed in the trenches 28 to form a conductive region (36 FIG. 4). The dielectric liner 32 can include a metal doped germanium oxide, although other materials can be employed. In one embodiment, the germanium oxide includes $GeO_2$. The germanium oxide is doped with a metal. The metal can include, e.g., Y, Hf, Al, Sc, La, although other metals and combinations of these and other metals can be employed. In a particularly useful embodiment, the metal includes Y (Yttrium). The metal doped germanium oxide is a dielectric material and can be employed as an electrical insulator.

The liner 32 can be formed by atomic layer deposition (ALD) although other processing techniques (e.g., CVD) can be employed. The liner 32 contacts the layers 14, 16, 24 and 26 along their thicknesses on the sides of the fin 30 in the trenches 28. In particular, in the embodiment described, the dielectric liner 32 contacts the sides of the high concentration layer 20 of the base 16.

Figure 4:
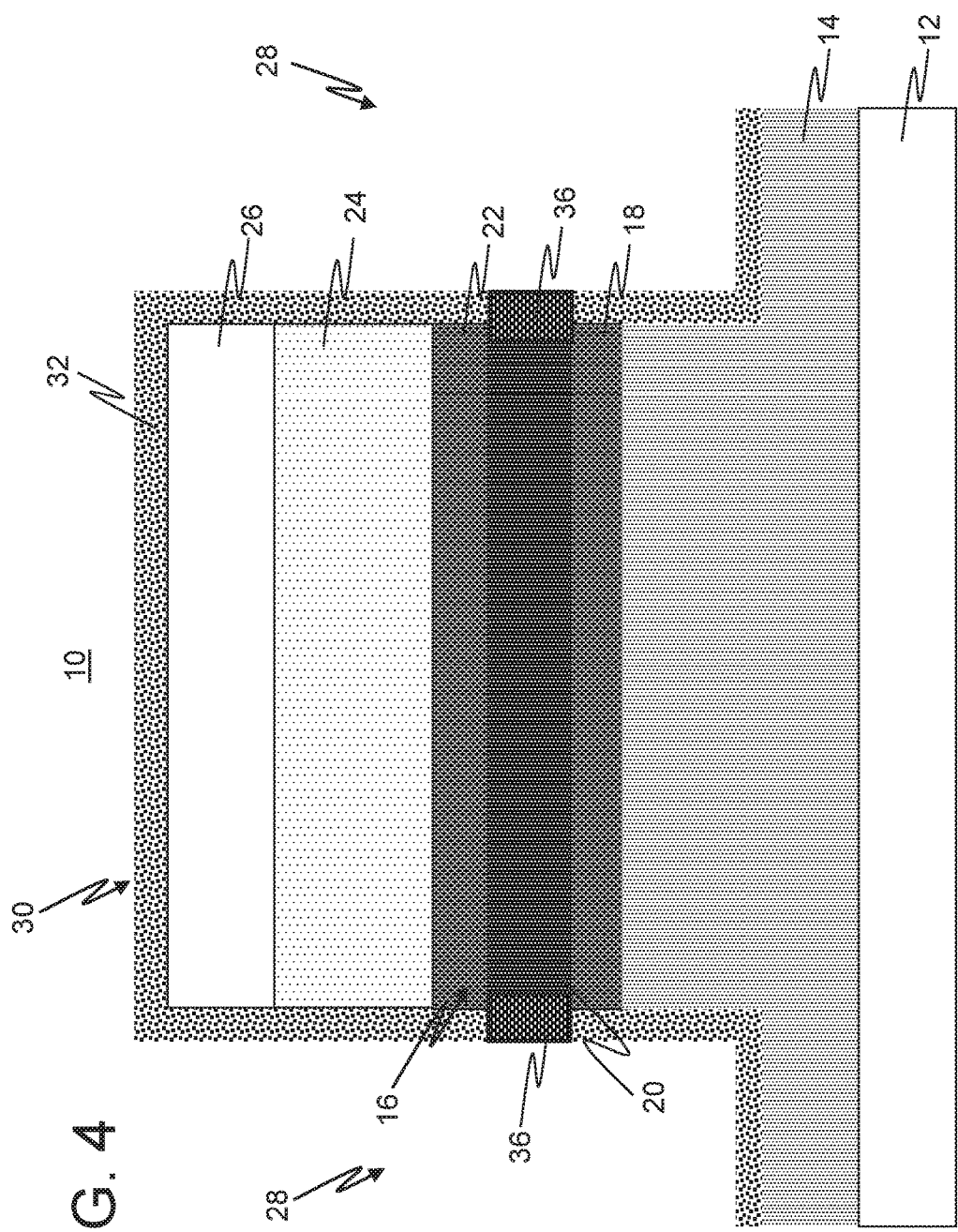
FIG. 4 is a cross-sectional view showing the stack of layers of FIG. 3 after an anneal that forms conductive regions on the vertical sidewalls of the fin, the conductive regions being self-aligned to the base in accordance with an embodiment of the present invention.

Referring to FIG. 4, an anneal process is performed to cause a reaction between the liner 32 and the high concentration layer 20 of the base 16. In one embodiment, Y-doped $GeO_2$ of the liner 32 that is formed on the SiGe of the layer 20 of the base 16 is selectively converted to a metallic material by thermal anneal. The thermal anneal process can include a temperature of below about 600 degrees C. in a $N_2$ ambient environment, and more particularly, between about 400 degrees C. and about 600 degrees C. The duration of the anneal can be a few seconds to less than about one minute. The duration is dependent on the structure and the temperature.

In one embodiment, a reaction occurs when the Ge content of the layer is higher, e.g., over about 20%. The higher concentrations of Ge in the SiGe of the base 16 will cause the reaction to occur faster and be more complete. In this way, the size and shape of conductive regions 36 can be controlled by the concentration and location of the Ge content of the base 16. The size (thickness) and concentration of Ge in the high concentration layer 20 dominants the size and shape of regions 36. Regions 36 result from the reaction between the liner 32 and the high concentration layer 20. The regions 36 form a metal germanide and/or a metal silicide aligned with the base 16.

The anneal causes germanium oxide to desorb from the dielectric liner 32 in the presence of Ge in the stack of layers (BJT device) and, in particular, the SiGe base 16. The more the Ge amount the more the germanium oxide desorption occurs and the more Ge diffuses into the liner 32 where the desorption has occurred. In the conductive regions 36, the metal dopant of the liner creates a metallic bond with the Ge and a metal-Ge bond occurs to form a metal germanide or metal silicide (Si is also present).

In one illustrative device structure, the emitter and the collector of the BJT can include Si, while the base includes SiGe (e.g., 10% to 50% Ge). A metal-doped $GeO_x$ liner can be formed over end portions (e.g., the thickness) of the SiGe layer. The $GeO_x$ liner can include dopant metal species, such as, e.g., Y, Hf, Al, Sc, La or other metals. The $GeO_x$ liner can be annealed to convert the metal doped $GeO_x$ liner to a metal germanide or metal silicide at positions that are in contact with the Ge or SiGe. The metal germanide or metal silicide forms a self-aligned contact that contacts the SiGe (or Ge) layer in the BJT. It should be understood that while the base is employed for forming the self-aligned conductive regions 36, other layers in the stack can be employed instead of or in addition to the base to form the conductive regions 36.

Figure 5:
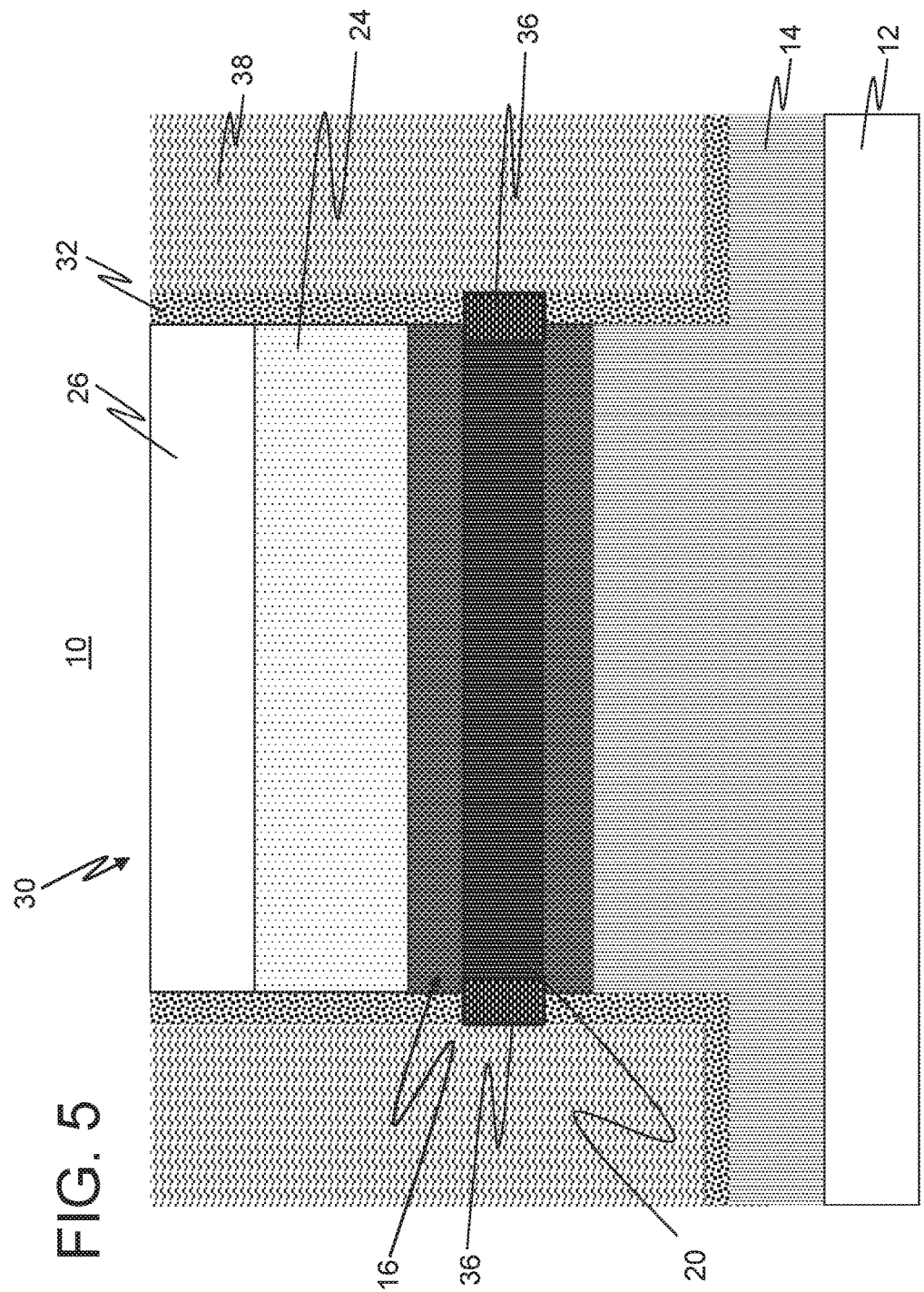
FIG. 5 is a cross-sectional view showing the stack of layers of FIG. 4 after a field dielectric is deposited and planarized in accordance with an embodiment of the present invention.

Referring to FIG. 5, a field dielectric 38 is deposited over the device 10 and fills in the trenches 28. The field dielectric 38 can include an oxide, such as, a silicon oxide although other dielectric materials can be employed. The field dielectric 38 is planarized down to the hard mask 26 also removing the liner 32 from the hard mask 26. The planarization can include a chemical mechanical polish (CMP) process.

Figure 6:
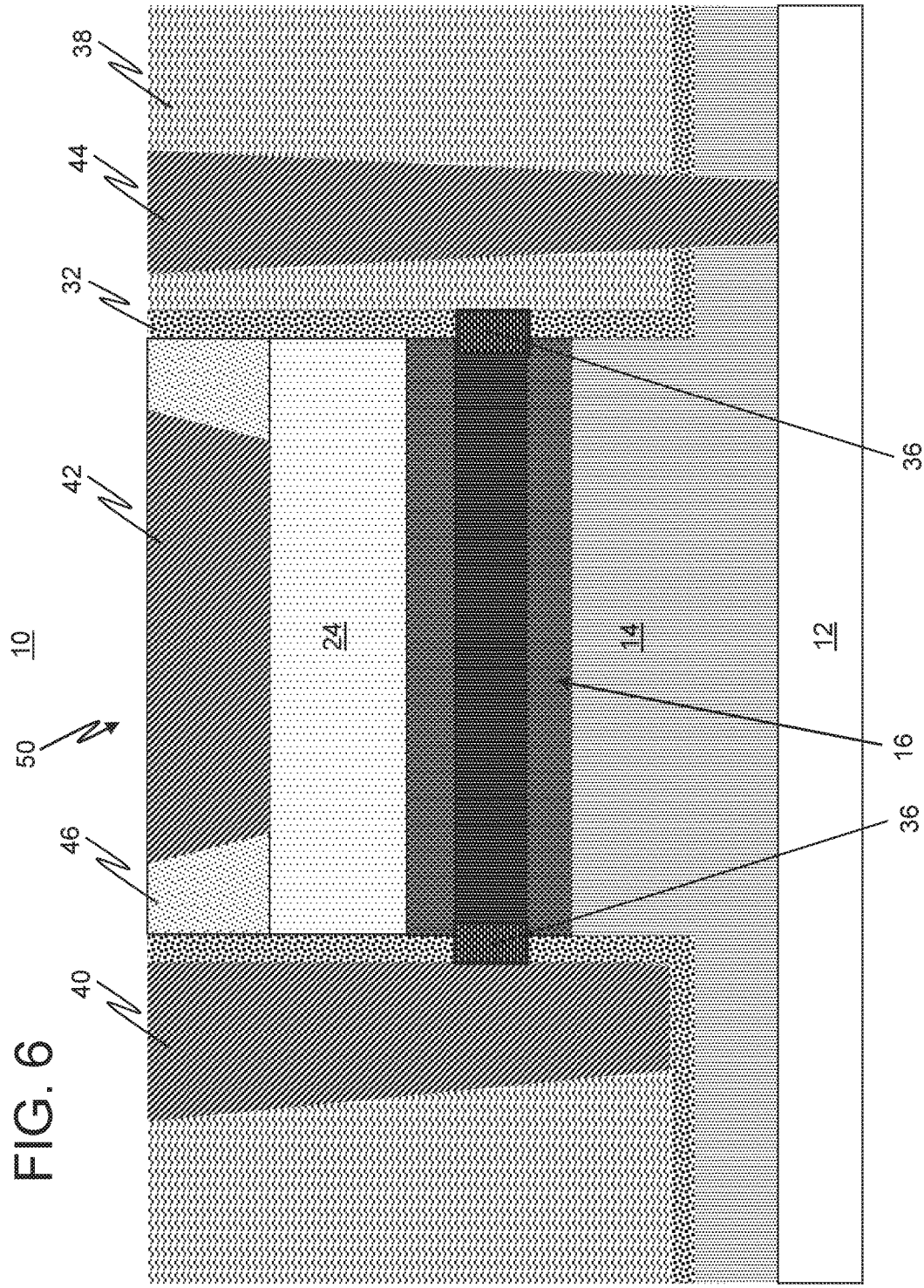
FIG. 6 is a cross-sectional view showing a bipolar junction transistor of FIG. 5 after contacts are formed to the base, emitter and collector in accordance with an embodiment of the present invention.

Referring to FIG. 6, the hardmask 26 can be removed by a selective strip etch. The hardmask 26 can be replaced by a dielectric material 46 and planarized (e.g., by CMP). The dielectric material 46 preferably includes a same material as the field dielectric 38. The field dielectric 38 and the dielectric material 46 are patterned to form contact openings. A metal deposition process is performed to deposit a metal into the contact openings. The metal deposition can include any suitable conductive material, such as polycrystalline or amorphous silicon, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotubes, conductive carbon, graphene, or any suitable combination of these materials. The conductive material may further comprise dopants that are incorporated during or after deposition.

A planarization process, e.g., CMP, removes excess conductive material to form a base contact 40, an emitter contact 42 and a collector contact 44 to form a BJT 50. The base contact 40 connects with a corresponding conductive region 36. The region 36 is exposed during the formation of the contact holes and is self-aligned since the location of the contact hole for the base contact 40 can employ the liner 32 to position the contact relative to the region 36. The base contact 40 is located adjacent to the base 16 without the need of highly doped regions that consume chip layout area. Instead, the base contact 16 is separated by the liner 32, which has a thickness of, e.g., between about 2 nm and about 20 nm.

The vertical orientation of the device 10 due to the formation of the fin 30 permits the emitter contact 42 to be within the footprint are of the BJT 50. The formation of trenches 28 (FIG. 2) permits a landing point for the collector contact 44.

Since the BJT 50 is vertically oriented with a self-aligned base contact 40, the BJT 50 is scalable and the base and collector contact distances from the base 16 of the BJT 50 can be made closer while preventing shorting between these terminals. The base 16 can be made as large as needed, and the base 16 is easily contacted using the self-aligned conductive regions 36 to contact the base 16. Interconnects, such as contacts 40, 42 and 44 are vertically oriented and reduce limitations on the transistor layout.

Figure 7:
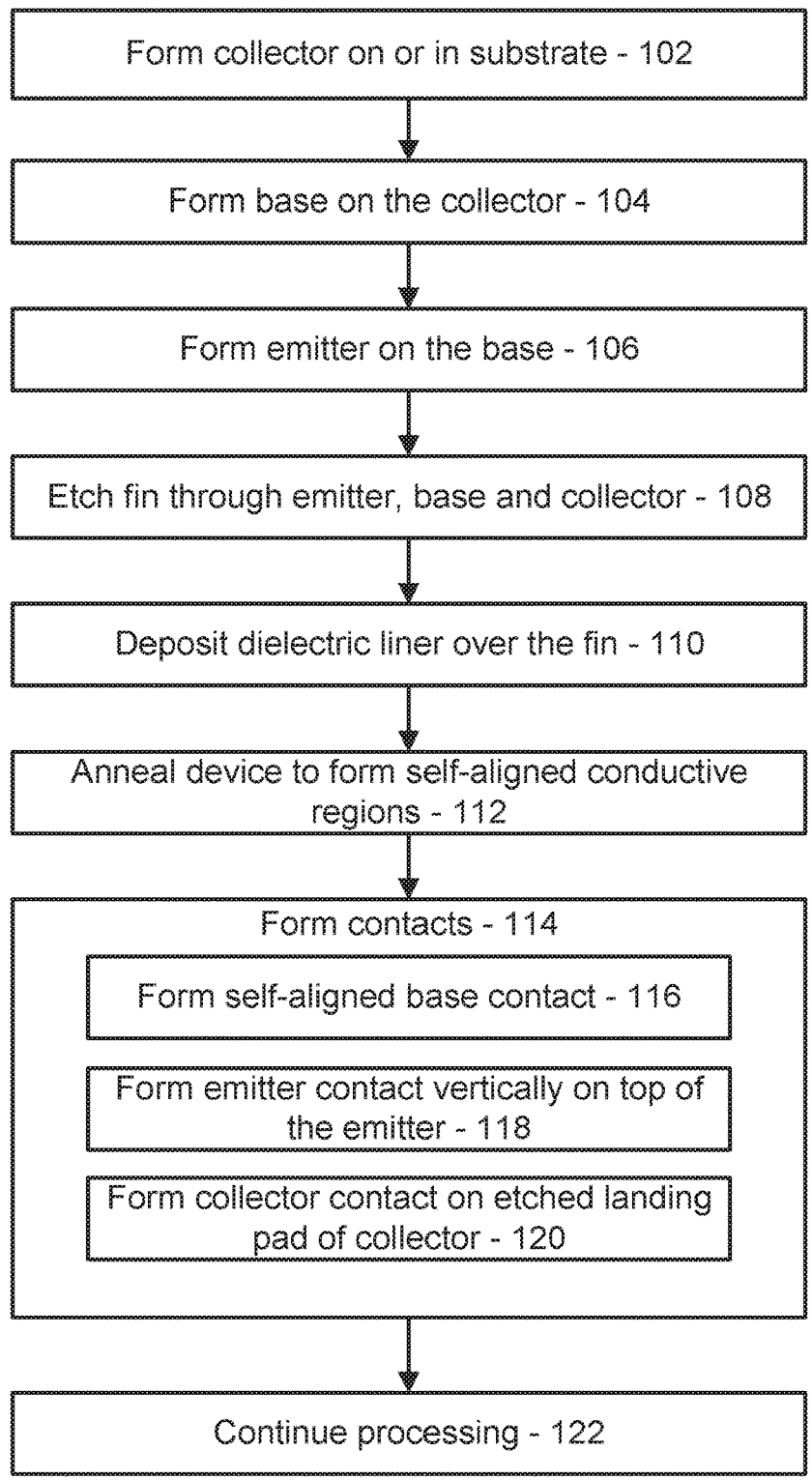
FIG. 7 is a block/flow diagram showing methods for forming bipolar junction transistors in accordance with illustrative embodiments of the present invention.

Referring to FIG. 7, methods for forming a bipolar junction transistor are illustratively described. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a collector is formed on or in a substrate. The collector can be formed by doping a region of the substrate or may be formed by growing the collector (e.g., epitaxially) from the substrate. The substrate and/or the collector can be doped using an ion implantation process or other doping technique.

In block 104, a base is formed on the collector. The base can be formed using an epitaxial growth process. The base can be doped in-situ. The base can include SiGe and the Ge content can be varied during growth. The Ge amount can include a region of higher concentration. The region of higher concentration can be formed to provide a sufficient amount of Ge for mixing with a liner in later steps and to provide separation from adjacent layers, e.g., using the lower Ge doped base regions to provide some distance from adjacent layers in the stack of layers when the conductive regions are formed. The dimensions of the base and/or the dimensions of the higher doped region can be employed later to size a conductive region that will be formed and ensure no shorting to adjacent layers.

The base on the collector can be epitaxially grown using SiGe with a graded profile having a region of higher Ge concentration, and the conductive region can be formed through the dielectric liner which corresponds with the region of higher Ge concentration. In one embodiment, the higher Ge concentration can be the entire side of the base layer or less.

In block 106, an emitter is formed on the base. The emitter can be formed using an epitaxial growth process. The base can be doped in-situ.

In block 108, a fin or fins can be patterned from the emitter, base and into the collector to form trenches on sides of the vertical fin. The vertical fin can include the emitter, the base and at least a portion of the collector. The collector can include a first surface on a first level (e.g., bottom of the trenches) and a second surface on a second level on which the base is formed. The formation of trenches can include the use of a patterned hardmask that can be patterned using lithography and etching the trenches in accordance with the hardmask pattern. The etch (e.g., RIE) exposes vertical sidewalls of the base, emitter and a portion of the collector.

In block 110, a dielectric liner is deposited on vertical sidewalls of the collector, the base and the emitter and on the first surface of the collector. The dielectric liner can include a germanium oxide. The germanium oxide is preferably metal doped. The metal doped germanium oxide can include a metal selected from the group consisting of Y, Hf, Al, Sc, La and combinations thereof.

In block 112, the device is annealed to interact and mix the base materials with the dielectric liner materials to form a self-aligned conductive region through the dielectric liner on the vertical sidewalls. In one embodiment, the Ge of the base mixes with the metal doped germanium oxide to form a metal germanide or a metal silicide.

In block 114, contacts are formed. This can include forming a field dielectric (e.g., oxide) in the trenches, planarizing a top portion of the dielectric liner (on the hardmask) and the field dielectric, replacing the hardmask with field dielectric, patterning contact holes, filling the contact holes with conductor and planarizing to form contacts.

In block 116, a base contact is formed along one of the vertical sidewalls to connect the base to the base contact through the conductive region. In block 118, an emitter contact is formed on top of the emitter. In block 120, a collector lands on the first level of the collector (e.g., a landing pad etched in the collector at the bottom of a trench or trenches). This ensures sufficient separation from the BJT device and provides enough dielectric material between the contacts and the BJT device.

In block 122, processing can continue to complete the device. This can include the formation of other devices, contacts, metal lines, etc.

Having described preferred embodiments for a vertical fin-type bipolar junction transistor with self-aligned base contact (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A bipolar junction transistor, comprising:
   a collector having a first surface on a first level and a second surface on a second level;
   a base formed on the second level of the collector;
   an emitter formed on the base;
   a dielectric liner formed on vertical sidewalls of the collector, the base and the emitter and over the first surface, wherein the dielectric liner includes germanium oxide;
   a conductive region formed adjacent to the base within the dielectric liner; and
   a base contact formed along one of the vertical sidewalls to connect to the base through the conductive region.

2. The bipolar junction transistor as recited in claim 1, wherein the base includes a graded profile having a region of higher reactant concentration and the conductive region being formed adjacent to the base corresponding with the region of higher reactant concentration.

3. The bipolar junction transistor as recited in claim 1, wherein the base includes germanium.

4. The bipolar junction transistor as recited in claim 1, wherein the conductive region formed adjacent to the base includes a metal silicide or metal germanide.

5. The bipolar junction transistor as recited in claim 1, wherein the base contact is self-aligned to the conductive region along the liner on the vertical sidewall of the base.

6. The bipolar junction transistor as recited in claim 1, further comprising a collector contact landing on the first level of the collector.

7. A bipolar junction transistor, comprising:
   a collector having a first surface on a first level and a second surface on a second level;
   a base formed on the second level of the collector;
   an emitter formed on the base;
   a metal doped dielectric liner formed on vertical sidewalls of the collector, the base and the emitter and over the first surface;
   a conductive region self-aligned to the base and formed through the dielectric liner corresponding to a position on the vertical sidewall of the base;
   a base contact formed along the vertical sidewall of the base to connect to the base through the conductive region;
   an emitter contact formed on the emitter; and
   a collector contact landing on the first level of the collector.

8. The bipolar junction transistor as recited in claim 7, wherein the base includes a graded profile having a region of higher Ge concentration and the conductive region is positioned on the liner corresponding to the region of higher Ge concentration.

9. The bipolar junction transistor as recited in claim 7, wherein the dielectric liner includes germanium oxide.

10. The bipolar junction transistor as recited in claim 7, wherein the dielectric liner includes a metal doped oxide.

11. The bipolar junction transistor as recited in claim 10, wherein the metal doped oxide includes a metal selected form the group consisting of Y, Hf, Al, Sc, La and combinations thereof.

12. The bipolar junction transistor as recited in claim 7 wherein the base includes germanium.

13. The bipolar junction transistor as recited in claim 7, wherein the conductive region includes a metal silicide or metal germanide.

14. A bipolar junction transistor, comprising:
- a collector having a first surface on a first level and a second surface on a second level;
- a base formed on the second level of the collector;
- an emitter formed on the base;
- a dielectric liner formed on vertical sidewalls of the collector, the base and the emitter and over the first surface, wherein the dielectric liner includes a metal doped oxide;
- a conductive region formed adjacent to the base within the dielectric liner; and
- a base contact formed along one of the vertical sidewalls to connect to the base through the conductive region.

15. The bipolar junction transistor as recited in claim 14, wherein the metal doped oxide includes a metal selected form the group consisting of Y, Hf, Al, Sc, La and combinations thereof.

16. The bipolar junction transistor as recited in claim 14, wherein the base includes a graded profile having a region of higher reactant concentration and the conductive region being formed adjacent to the base corresponding with the region of higher reactant concentration.

17. The bipolar junction transistor as recited in claim 14, wherein the base includes germanium.

18. The bipolar junction transistor as recited in claim 14, wherein the conductive region formed adjacent to the base includes a metal silicide or metal germanide.

19. The bipolar junction transistor as recited in claim 14, wherein the base contact is self-aligned to the conductive region along the liner on the vertical sidewall of the base.

20. The bipolar junction transistor as recited in claim 14, further comprising a collector contact landing on the first level of the collector.

* * * * *